March 18, 1969 W. J. BOCZAR ET AL 3,434,018

HEAT CONDUCTIVE MOUNTING BASE FOR A SEMICONDUCTOR DEVICE

Filed July 5, 1966

(Actual Size)

INVENTORS
William J. Boczar
William C. Davis

BY Mueller, Aichele & Rauner

ATTYS.

United States Patent Office 3,434,018
Patented Mar. 18, 1969

3,434,018
HEAT CONDUCTIVE MOUNTING BASE FOR A SEMICONDUCTOR DEVICE

William J. Boczar and William C. Davis, Scottsdale, Ariz., assignors to Motorola, Inc., Franklin Park, Ill., a corporation of Illinois Filed July 5, 1966, Ser. No. 562,597
U.S. Cl. 317—234 4 Claims
Int. Cl. H01l 5/02, 1/02, 1/12

ABSTRACT OF THE DISCLOSURE

A semiconductor device is mounted on a heat conductive base comprising a generally disk-shaped major mounting base of aluminum having a cavity filled by a copper insert on which the semiconductor unit is located. The combination is enclosed within a metallic cover welded to the major mounting base.

This invention relates to an improved semiconductor device and more particularly to a semiconductor device having a novel mounting base.

Semiconductor devices employed in high current or high voltage applications, commonly referred to as power devices, generate a substantial amount of heat in the operation of the device. The commercial acceptability of such devices in conventional electronic circuit applications to a degree is based on their ability to dissipate the generated heat at a sufficiently high rate so acceptable operating characteristics will be maintained in normal as well as severe temperature operating conditions. Excessive heat retention has an adverse effect on the operation of power transistors in that it reduces power handling ability, and this effect can destroy the semiconductor unit within the device.

Because of the importance of rapid heat dissipation in power devices, it is customary to employ a heat conductive member of substantial mass as a heat sink to transfer heat from the semiconductor unit during operation of the device. This heat sink also may function as a mounting base or support for other elements of the device; for example, the die, cap, terminals, etc.

A common power device configuration utilizes a one-piece copper base of substantial thickness which provides a high rate of heat dissipation and easy mounting in electronic equipment. The base has an integral pedestal or raised portion which serves as a holder for an active semiconductor die unit and at the same time serves with the remainder of the one-piece base as one of the electrodes of the semiconductor device. In such an assembly, the collector junction is mounted on the pedestal portion, and the heat generated is conducted from the unit with a high degree of efficiency.

While it has been common to use copper for the heat sink, shortages and the increasing cost of copper have increased efforts to substitute other materials such as aluminum. Since aluminum has approximately twice the thermal resistance of copper, i.e., one-half the heat conductivity, the dissipation of heat from the semiconductor unit of the device may present a problem.

Other approaches have been tried in an attempt to find a suitable substitute for the copper heat sink. For example, disks of copper have been brazed onto a steel base. However, the thermal resistance of such structures is quite high because of the relatively low conductivity of the steel. Thus, the heat dissipation is poor as compared with copper.

A further problem in finding a suitable substitute for the conventional copper base is the desirability of sealing the cap onto the base at relatively low temperatures. While copper or aluminum caps can be cold welded onto a copper or aluminum base, steel requires substantially higher temperatures which may adversely affect the performance characteristics of the semiconductor unit.

Another consideration in the use of combinations of copper with other metals is the extra fabrication operations which may be required to secure the copper to the base. It is desirable to perform all of the soldering or other connecting operations simultaneously, but this may not be possible when a combination base including steel is employed.

From the above discussion, it is apparent none of the substitutes proposed to replaced copper heat sinks have proven completely satisfactory since all have possessed one or more deficiencies in performance characteristics or fabrication procedures.

An object of the present invention is to provide a semiconductor device having an inexpensive heat sink base with performance characteristics similar to those of copper.

A further object of the invention is to provide such a semiconductor device in which also the cover may be sealed to the base by cold welding.

An additional object of the invention is to provide such a semiconductor device which also may be fabricated by conventional procedures without extra processing.

Another object of the invention is to provide a semiconductor device which minimizes mounting base changes for devices of different power requirements.

A feature of the present invention is the employment of a novel heat sink base in a semiconductor device, the base being fabricated of an inexpensive metal with a cavity therein in which is disposed an insert made of a metal more highly heat conductive than the metal of the base, the insert providing a support for the semiconductor unit of the device.

Referring now to the drawing.

The present invention relates to a semiconductor device having a semiconductor unit, a heat conductive mounting base for said unit and a cap covering the semiconductor unit and secured to the base, and is embodied particularly in the combination of cavity in the base, an insert of a metal more highly heat conductive than the base disposed within the cavity with a portion of the insert exposed, and a semiconductor unit secured to said exposed portion of the insert.

Figure 1:
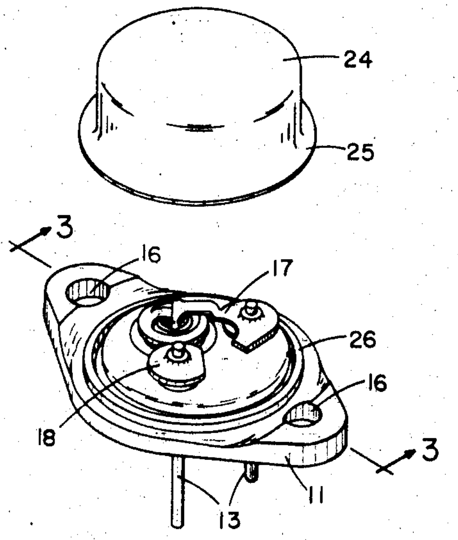
FIG. 1 is an exploded view in perspective of a semiconductor device of the invention with the cover separated from the base.
Figure 2:
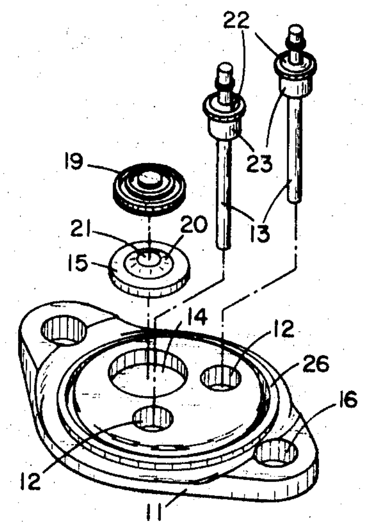
FIG. 2 is an exploded view in perspective of the base shown in FIG. 1 with the insert and terminals separated.
Figure 3:
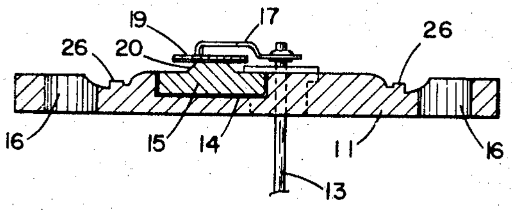
FIG. 3 is a cross-sectional view taken along line 3—3 of FIG. 1.
Figure 4:
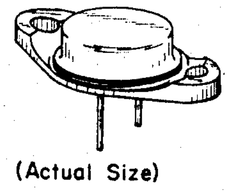
FIG. 4 is an assembled semiconductor device of one commercial embodiment of the invention shown in actual size.

As shown in the drawing, a mounting base 11 has openings 12 (FIG. 2) therethrough for terminals 13. The base 11 also has a cavity 14 to accommodate an insert 15. Adjacent the ends of the base 11 are openings 16 for suitable mounting bolts or the like (not shown) to mount the device. Clips 17 and 18 connect the terminals 13 to a die 19 (FIG. 3) secured to the upwardly extending pedestal portion 20 of insert 15. The insert 15 is of a size that when it is positioned in cavity 14 the pedestal portion 20 of the insert extends above the base 11 so the die 19 on surface 21 of the insert is spaced from the base surface. Terminals 13 are maintained in proper position within openings 12 by means of insulating sleeves 22 which are surrounded by flanged collars 23. A cap 24 is sealed to the base with a flange 25 of the cap engaging a raised annular surface 26 of the base.

More particularly as to the base of the semiconductor device of the invention, it may be of a diamond configuration as shown in the drawing or of another suitable configuration, e.g., a circular disk. The base may be stamped from a relatively thick strip of a metal which is heat and electrically conductive, is inexpensive, and may be readily worked when cold welding or soldering a cap or cover to it in a hermetic seal. Aluminum or an aluminum alloy preferably is used. Cavity 14, openings 12 and 16, and annular surface 26 are formed in the base simultaneously or sequentially. The cavity is preferably circular in shape with a bottom and a sidewall, with the depth of the cavity being less than the thickness of the base at the location of the cavity.

The insert 15 is of a size to provide a close fit with the cavity 14. The insert is preferably formed of copper or a copper alloy so that heat dissipates from the semiconductor die 19 at a very rapid rate.

The various elements, e.g., terminals 13, insert 15, die 19, etc., are assembled with base 11 and secured thereto by means of a fusible solder. Advantageously, the soldering is accomplished simultaneously using solder preforms (not shown) which are positioned between the elements and the contacted portions of the base during assembly. The soldering is performed in an inert or reducing atmosphere, to melt the solder and fuse the elements to the base. The use of the combination of cavity 14 and insert 15 in the device of the invention facilitates simultaneous soldering with the insert being fused to the base without a separate soldering operation.

After the soldering has been completed, the cap 24 is positioned on the base 11 with the flange 25 thereof contacting the raised annular surface 26 of the base. The cap and base are sealed together to form a hermetically sealed enclosure for the operating elements of the device. The sealing is preferably accomplished by cold welding the flange of the cap to the annular surface of the base by the application of pressure. The sealing is effected without applying heat or electrical current to either the cap or the base. Also, no spattering, contamination or out gassing occurs such as would be the case with soldering or electrical welding.

The utilization of a highly conductive metal insert within a cavity in the base provides a larger surface area for rapid dissipation of heat from the semiconductor unit through the insert into the mass of the base. With an insert of the configuration shown in the drawing, contact is provided between both the sidewall and bottom of the insert and the corresponding surfaces of the cavity for efficient heat dissipation. As an example, a device having a base with a major diameter of about 1½", a minor diameter of about 1" and a thickness of about ⅛" made from 3003H–14 aluminum alloy employing an insert about ⅓" in diameter and $\frac{1}{10}$" thick made from ETP copper has a thermal resistance only about 20 percent greater than that of a comparable device made with a conventional one-piece copper base. In contrast, the thermal resistance of a device with a base made entirely of aluminum has a thermal resistance about 100 percent more than that of copper.

Another advantage achieved through the use of the mounting base of the present invention is interchangeability. For example, in the fabrication of devices with different power requirements, various sizes and shapes of semiconductor units are required. These units in turn may utilize mounting bases with different surface configurations. However, with the device of the present invention, the same mounting base can be used for a wide variety of devices and only a new insert substituted. Thus, the inventory requirement of bases for a variety of different power devices is substantially reduced.

From the above description and drawing it is apparent that the semiconductor device of the present invention provides substantially the same performance characteristics as devices using a copper base while approaching the cost of devices with aluminum bases. Moreover, the forming of the cavity may be accomplished at the same time as the stamping of the base itself. Also, the device of the invention may be fabricated by conventional procedures without extra soldering steps, and the sealing of the cap to the base accomplished by conventional cold welding techniques.

We claim:

1. A semiconductor device comprising a heat conductive metallic mounting base having a generally disk-shaped configuration with a cavity or recessed area in one side thereof, said cavity extending through a major fraction of the thickness of said base, a metallic insert fixed within said cavity, said insert having a substantially greater thermal conductivity than said base, the insert being large enough to substantially fill said cavity, a semiconductor unit mounted on said insert, and a metallic cover welded to said major mounting base to enclose and protect said semiconductor unit.

2. A semiconductor device as defined by claim 1 wherein the major mounting base is aluminum or an aluminum alloy, and the insert consists of copper or a copper alloy.

3. A semiconductor device as defined by claim 1 wherein said insert is bonded within said cavity by means of a fusible solder.

4. A semiconductor device as defined by claim 1 wherein the extent of said cavity is a minor fraction of extent of the surface of said major mounting base.

References Cited

UNITED STATES PATENTS

| | | | |
|---|---|---|---|
| 2,964,830 | 12/1960 | Henkels et al. | 317—234 |
| 3,248,615 | 4/1966 | Weisshaar et al. | 317—235 |
| 3,279,039 | 10/1966 | Nippert | 317—234 |
| 3,311,798 | 3/1967 | Gray | 317—234 |
| 3,319,134 | 5/1967 | Czakvary | 317—234 |

JOHN W. HUCKERT, *Primary Examiner.*

R. F. POLISSACK, *Assistant Examiner.*

U.S. Cl. X.R.

317—235